United States Patent [19]
Lenaerts

[11] 4,232,203
[45] Nov. 4, 1980

[54] INTEGRAL TELEPHONE SET AND HANDSET

[75] Inventor: George V. Lenaerts, London, Canada

[73] Assignee: Northern Telecom Limited, Montreal, Canada

[21] Appl. No.: 9,655

[22] Filed: Feb. 5, 1979

[51] Int. Cl.³ .................... H04M 1/02; H04M 1/03
[52] U.S. Cl. .................................... 179/103; 179/179
[58] Field of Search .................... 179/103, 178, 179

[56] References Cited

U.S. PATENT DOCUMENTS

| | | |
|---|---|---|
| 3,123,676 | 3/1964 | Prescott et al. .................... 179/103 |
| 3,627,930 | 12/1971 | Tolman .............................. 179/103 |
| 4,124,785 | 11/1978 | Seretny et al. ...................... 179/103 |

*Primary Examiner*—Daryl W. Cook
*Attorney, Agent, or Firm*—Sidney T. Jelly

[57] ABSTRACT

An integral telephone set and handset has two cooperating housings forming a hollow handset with a rigid support member in the form of a porcelain coated steel plate which carries the pushbutton assembly on one side and the electrical components or devices on the other. The receiver, transmitter and line switch and recall button can also be mounted on the support member.

11 Claims, 4 Drawing Figures

INTEGRAL TELEPHONE SET AND HANDSET

This invention relates to an integral telephone set and handset, and is particularly concerned with a telephone handset in which all the telephone set components, electrical and electronic, are situated in the handset, the components mounted on a common rigid substrate or support member.

The present invention is concerned with providing a single piece telephone unit which is easy and economical to manufacture. The invention enables use of solid state technology to replace the majority of conventional electrical and electrical/mechanical components by electronic components and the entire assembly of all components is housed in what, for convenience, is referred to as the handset. It is necessary to provide a line switch which is actuated on putting down the handset after use, and therefore some form of structure is necessary onto which the handset is placed to cause actuation of the switch, but this structure can vary considerably in form, as the only requirement is some part of formation against which the switch will rest and be actuated.

The pushbutton dial or keyboard, line switch, transmitter and receiver, and electronic network and dial or keyboard components are all mounted on a common member, of porcelain coated steel, which provides a rigid backbone for the unit.

In its broadest aspect, the invention provides an integral telephone set and handset comprising two cooperating housing parts forming a hollow interior, and a rigid support member in the form of a flat plate like member having a printed circuit on each surface, a pushbutton assembly assembled to the circuit on one surface and electronic components assembled to the other surface, a receiver and transmitter mounted on opposite ends of the support member, the support member mounted in the hollow interior of the handset. An acoustic horn is preferably provided to connect the transmitter to the mouthpiece portion of the handset. A ringer can be mounted at the mouthpiece portion. A line switch is conveniently mounted at the earpiece portion of the handset.

The invention will be readily understood by the following description of a particular embodiment, as an example only, in conjunction with the accompanying drawings, in which.

Figure 1:
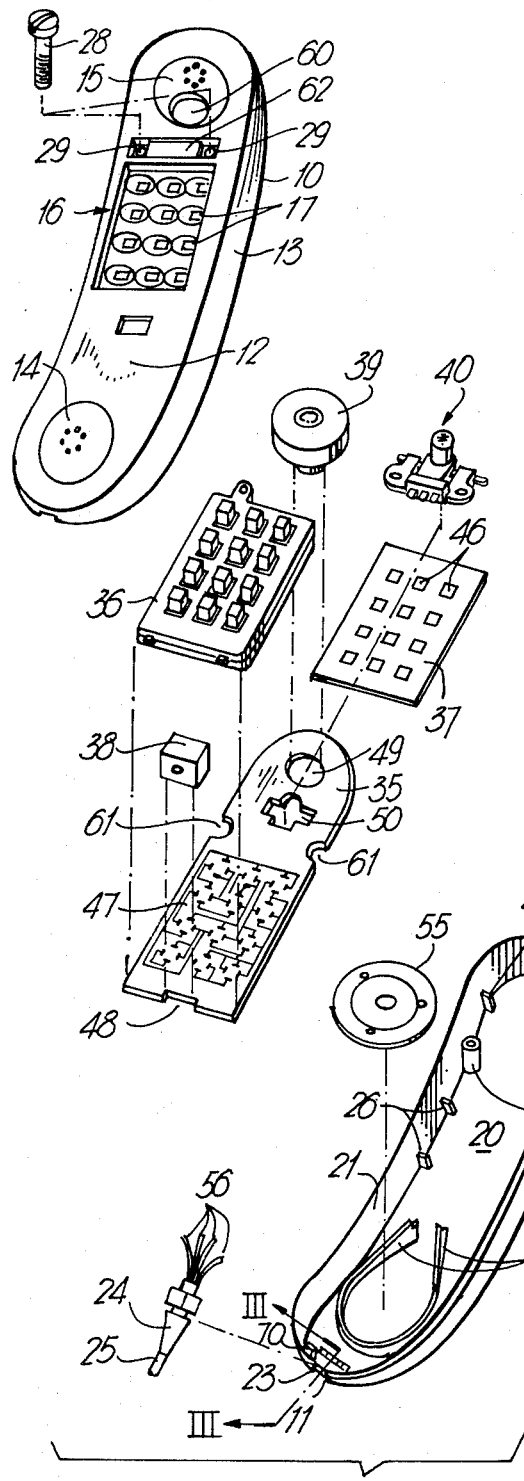
FIG. 1 is an exploded perspective view of the handset.

As illustrated in FIG. 1, the handset comprises two housings, a top housing 10 and a bottom housing 11. Each housing is hollow, the top housing having a front surface 12 with a rearwardly extending peripheral rim 13. The housing is curved when viewed in longitudinal cross-section to suit the face of a user and position a perforated mouthpiece portion 14 adjacent to the mouth of the user. At the end remote from the mouthpiece portion 14 is a perforated earpiece portion 15. Intermediate the mouthpiece and earpiece portions is the pushbutton or key position indicated generally at 16. What is normally a separate bezel member in many conventional telephones is molded as part of the housing to define a plurality of apertures 17 arranged in columns and rows.

The bottom housing has a back surface 20 with a forwardly extending peripheral rim 21. The bottom housing is curved, viewed in longitudinal cross-section, to match the top housing. At one end, corresponding to the mouthpiece portion 14 of the top housing, is formed an acoustic horn 22 conveniently formed by a side moulded on the back surface 20. Also at this end, in the rim 21, is a slot 23 into which fits the grommet 24 around the cord 25.

At positions around the inside of the bottom housing are provided small ribs or extensions 26. Also two bosses 27 are provided for screws holding the housings together, the screws indicated at 28 and passing through holes 29 in the top housing.

Positioned in the hollow space formed by the two housings is support member 35 carrying the pushbutton or key member 36, a spring contact member 37, a transmitter 38, receiver 39, a line switch and recall button 40, the above all mounted on the front or top surface of the support member 35.

Figure 2:
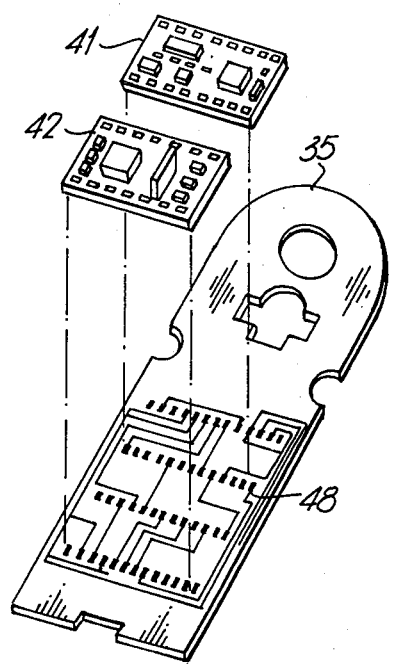
FIG. 2 is an exploded perspective view on the rear surface of the support member.

As illustrated in FIG. 2, a network hybrid 41 and a digital hybrid 42 are mounted on the back surface of the support member 35. The hybrid 42 is of two alternate forms depending upon whether pulses or tone generation are required—to suit the central office equipment.

The pushbutton or key member 36 and spring contact member 37 are similar to the pushbutton switch described in U.S. Pat. No. 4,029,916, issued June 14, 1977; Canadian Pat. No. 1,034,157, issued July 4, 1978, the pushbutton member having the individual buttons or keys 45 moulded integrally with the support structure, each button or key positioned over a switch position 45 on the spring contact member 37. An electrically insulating flexible diaphragm, not shown in FIG. 1, can be positioned between the member 36 and member 37, if desired. The contacts at the switch positions 46 are aligned with contact areas of the circuit, indicated generally at 47, on the support member 35. This is as described in the above-mentioned patent. On depressing a button or key 45 a snap-action contact is made by the related switch 46 to the related contact areas of the circuit 47.

A further circuit 48 is formed on the back surface of the support member 35. Part of this circuit provides for interconnection between and with contact areas on the front face of the support member and forming part of the circuit 47. Interconnection between front and back surfaces is provided by holes through the substrate, with conductive material extending through the holes. The hybrid circuit members 41 and 42 are attached to the back surface of the support member 35 by, for example, heat bonding between contact areas on the basis of the members 41 and 42 and contact areas on the circuit 48.

The transmitter 38, in the example of an electret type, clips on to the support member 35 at a locating notch 48 in the end of the support member and is hard wired to the circuit 48 and thus to the hybrid circuit members. Receiver 39, for example, a balanced arm receiver or a dynamic receiver, is located in a hole 49 in the support member 35 and again is hard wired to the circuit 48 and thus to the hybrid circuit members. The line switch and recall button 40 is located in an aperture 50 in the support member 35 and is also hard wired to the circuit 48 and hybrid circuit.

A ringer 55, in the present example, is positioned at the mouthpiece end of the handset and sits on the bottom housing inside the acoustic horn 22. The ringer is also wired to the circuit 48, and the conductors 56 of the cord 25 pass either side of the acoustic horn and are attached, as by soldering, to the circuit 48.

Figure 3:
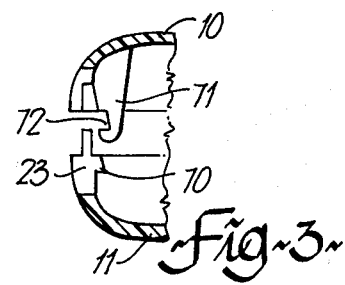
FIG. 3 is a cross-section on the line III—III of FIG. 1.

The ringer is dropped into position inside the acoustic horn and the cord grommet 24 positioned in the slot 23 in the end of the bottom housing. With the substrate assembled with the hybrid circuit members, transmitter, receiver, line and recall switch, ringer and cord, it is positioned in the lower housing, resting on the ribs 26. The contact member 37 and button or key member 36 will also have been assembled to the support member. The top housing is then positioned over the bottom housing. At one end of the handset, in the example illustrated at the mouthpiece end of the handset, interengaging projections are provided on both housings. These are interengaged by presenting the mouthpiece end of the top housing to the same end of the bottom housing, with the housings indexed to one another. As the two housings are rotated together the formations engage. This is seen in FIG. 3 which is a cross-section through the one end of the two housings. In the example, two members or projections 70 are formed on the inner surface of bottom housing 11, one on each side of the slot 23. On the inside of the top housing two hook shaped members or extensions 71 are formed, in alignment with the projections 70 when the housings are assembled. The slots 72 in the hook shaped members 71 engage over the projections 70. By first positioning the mouthpiece ends of the two housings together, the members 70 and 71 interengage. The earpiece ends are then swung together, the screws 28 providing final attachment. When the housings are fully assembled, the rim 13 of the top housing 10 fits over a thin extension of the rim 21 of the bottom housing 11. The line and recall switch operating member extends through a hole 60 at the earpiece portion 15. The switch, transmitter 38, receiver 39 and ringer 55 are held in position by engagement with the top housing. The two housings are finally connected together by the screws 28, through the 29 in the top housing into the bosses 27 in the bottom housing. Cutouts or grooves 61 are provided in the support member 35 to clear the screws. After assembly a small plastic insert can be positioned in a recess 62 in the top housing, covering the heads of the screws and bearing, for example, the telephone number for the telephone set.

The positions of the ringer 55 and the line and recall switch 40 can vary. The particular positions shown in the drawings were selected to avoid the possibility of the ringer ringing near the ear of the user. In the example illustrated the ringer is removed physically as far as possible from the earpiece. Also, by positioning the switch 40 at the earpiece it is generally necessary to move the handset at least a short distance away from the users head before the switch can be actuated. If the switch is more readily accessible then it is possible that the user could actuate the switch and then before dialling the ringer be actuated by a call. If the ringer was adjacent to the ear this could be unpleasant. However, if desired, the ringer could be positioned elsewhere, and could be arranged to be positioned against a perforated portion of the bottom housing. In this instance the ringer could be mounted on the support member 35. The switch 40 could be positioned at or near the mouthpiece end, or even project through the bottom housing.

In this latter arrangement the set would then normally rest on the back housing when not in use, which is not desirable as dirt and dust can collect in the mouthpiece and earpiece portions.

Figure 4:
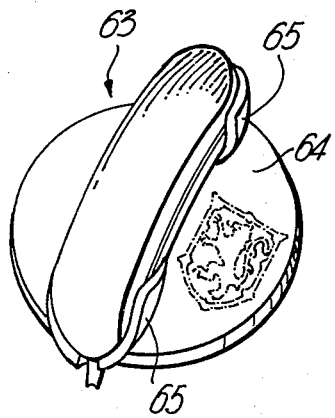
FIG. 4 is a perspective illustration of one form of base for the handset.

While only a minimal holding structure for the set is required, to provide actuation of the switch 40, generally a cosmetically appealing structure will be used. FIG. 4 illustrates one typical holding structure 63 comprising a base 64 and a moulded or otherwise formed receptacle 65 in which the handset rests. Other forms of structure can be provided, for horizontal or vertical holding of the handset, the only requirement being that the switch 40 be actuated when the handset is set down after use.

The support member, as stated, comprises a steel plate coated by porcelain. The porcelain is applied by an electrophoretic process in which a porcelain frit is deposited electrolytically onto the steel plate, followed by firing. Where interconnections are required through the plate, or where terminal members pass through the plate, holes are formed, the ends of the holes countersunk, as by coining, prior to deposition of the porcelain frit. The porcelain coating extends through any holes, coating the inner surfaces of the holes. After firing the circuits 47 and 48 are formed as by thick-film printing or any other convenient process. A convenient way is to deposit a thick film pattern containing silver through a mask followed by a further firing to fuse the silver onto the porcelain. To ensure an interconnection between circuit patterns on each side of the support member, the conductive material can be caused to continue through conveniently positioned holes in the support member. The thick film or other deposited material can be caused to extend through the holes by applying suction from the side remote from that on which the material is being deposited. Thus, for example, when circuit 47 is being applied, suction is applied from the back of the support member, and when circuit 48 is applied suction is applied from the front of the support member.

What is claimed is:

1. An integral combined telephone set and handset comprising an elongate hollow member having a perforated mouth position at one end, a perforated ear position at the other end, and a pushbutton dial position intermediate the mouth and ear positions, and an elongate rigid support member extending longitudinally in said hollow member, said support member comprising a steel sheet member having upper and lower surfaces and a porcelain layer on both surfaces; a contact circuit on the upper surface, the contact circuit including a plurality of switch positions each having a contact area; a spring contact assembly mounted on the upper surface and including a plurality of snap-action spring contact members, a member aligned with each switch position and contact area; a pushbutton assembly mounted on the upper surface over said spring contact assembly and including a plurality of pushbuttons, each pushbutton aligned with a spring contact member; said pushbuttons extending through apertures at said pushbutton dial position; circuit means on the lower surface of said support member, said circuit means including an electrical circuit pattern and electrical devices connected to said circuit pattern and said contact circuit; a transmitter mounted at one end on said support member and adjacent to said mouth position; a receiver mounted at the other end on said support member and adjacent to said ear position; a line switch mounted in said hollow member and including actuating means extending from within said hollow member; and a ringer mounted in said hollow member, the arrangement such that said support member carries the electrical and electronic circuit components of a telephone set.

2. An integral telephone set and handset as claimed in claim 1, said hollow member comprising an elongate top housing having a front surface and a peripheral rim extending rearwardly from the front surface, and an elongate bottom housing having a back surface and a peripheral rim extending forwardly from the back surface, the peripheral rims cooperating to form said hollow member, the perforated mouth position at one end of the top housing and the perforated ear position at the other end of the top housing.

3. Apparatus as claimed in claim 2, including an acoustic horn on an inner surface of said bottom housing, said horn acoustically coupling said transmitter to said perforated mouth position.

4. Apparatus as claimed in claim 3, said ringer positioned in said acoustic horn adjacent to said mouth position.

5. Apparatus as claimed in claim 2, including a plurality of extensions in said bottom housing, said extensions extending from said peripheral rim, said steel sheet circuit member positioned on said extensions.

6. Apparatus as claimed in claim 2, including interengaging projections at one end of said hollow member, one set of projections on said top housing and one set on said bottom housing, said projections interengaged on assembly of said housings to hold said housings together at said one end.

7. Apparatus as claimed in claim 6, said projections on said bottom housing projecting inward from and adjacent to the edge of said peripheral rim of said bottom housing, and said projections on said top housing projecting down from the front surface adjacent to said peripheral rim of said top housing and forming hook-shaped members, said hook-shaped members arranged to engage with the inwardly projecting projections on said bottom housing.

8. Apparatus as claimed in claim 6, including fastening means adjacent to the other end of said hollow member, retaining said housings together at said other end.

9. Apparatus as claimed in claim 1 said line switch mounted on said steel sheet circuit member.

10. Apparatus as claimed in claim 1 said line switch positioned at said ear position.

11. An assembly as claimed in claim 1, said electrical devices comprising hybrid circuit devices mounted on the lower surface.

* * * * *